United States Patent [19]
Hirayama et al.

[11] Patent Number: 5,821,277
[45] Date of Patent: Oct. 13, 1998

[54] THERMOSETTING AND PROCURING COMPOSITIONS FOR COLOR FILTERS AND METHOD FOR MAKING THE SAME

[75] Inventors: Takayuki Hirayama; Haruyoshi Sato, both of Kawasaki; Yutaka Otsuki, Yokohama; Masayuki Ando, Funabashi, all of Japan

[73] Assignees: Nippon Oil Co., Ltd.; Dai Nippon Printing Co., Ltd., both of Tokyo, Japan

[21] Appl. No.: 742,499

[22] Filed: Nov. 1, 1996

[30] Foreign Application Priority Data

Nov. 6, 1995 [JP] Japan ..................................... 7-287592

[51] Int. Cl.$^6$ ......................... C08K 3/04; C08F 265/04; G03F 7/033
[52] U.S. Cl. ............................... 522/50; 522/71; 522/96; 522/102; 522/103; 522/120; 522/121; 522/122; 428/1; 428/195; 430/7; 430/20; 523/205; 523/215
[58] Field of Search .................. 522/71, 96, 103, 522/107, 120, 121, 122, 102, 50; 523/205, 215; 428/1, 195; 430/7, 20

[56] References Cited

U.S. PATENT DOCUMENTS

| | | | |
|---|---|---|---|
| 4,775,500 | 10/1988 | Funakoshi et al. | 522/71 |
| 4,802,743 | 2/1989 | Takao et al. | 350/339 F |
| 5,362,603 | 11/1994 | Katoh et al. | 522/34 |
| 5,527,649 | 6/1996 | Sato et al. | 430/7 |
| 5,552,192 | 9/1996 | Kashiwazaki et al. | 427/492 |
| 5,593,757 | 1/1997 | Kashiwazaki et al. | 428/195 |
| 5,619,357 | 4/1997 | Angelopoulos et al. | 349/110 |
| 5,631,111 | 5/1997 | Niu et al. | 430/7 |

*Primary Examiner*—Susan W. Berman
*Attorney, Agent, or Firm*—Darby & Darby

[57] ABSTRACT

A thermosetting composition containing a carbonaceous material (1-1) and a thermosetting resin (1-2), the carbonaceous material (1-1) being obtained by reacting by contacting a carbon material (a) with a polymer (b) having in the molecule thereof at least one particular reactive group such as aziridine group, oxazoline group, N-hydroxyalkylamido group, epoxy group, or hydroxyl group, and an alkoxycarbonyl group represented by the formula $$R^1R^2R^3C\text{—}O\text{—}CO\text{—} \quad (1)$$

wherein each of $R^1$, $R^2$, and $R^3$ stands for a hydrogen atom or an organic residue selected from an alkyl group having 1 to 6 carbon atoms, a cycloalkyl group having 5 to 8 carbon atoms, an alkylcycloalkyl group having 6 to 16 carbon atoms, or an aryl group having 6 to 16 carbon atoms, wherein at least two of $R^1$, $R^2$, and $R^3$ stand for the organic residue which may be bonded cyclically with each other, and a photocuring composition containing the carbonaceous material (1-1), a photocuring compound (2-2) having at least one carbon-carbon double bond, and a photopolymerization initiator (2-3).

18 Claims, No Drawings

THERMOSETTING AND PROCURING COMPOSITIONS FOR COLOR FILTERS AND METHOD FOR MAKING THE SAME

BACKGROUND OF THE INVENTION

This invention relates to a thermosetting or photocuring composition. More specifically, it relates to a hardening composition suitable for manufacturing a light-shielding layer of a color filter for a liquid crystal display device.

Prior Art

A color liquid crystal display device is typically represented by a thin film transistor (TFT) active matrix color liquid crystal device. This device is provided with a substrate disposed on an inner polarizing plate, TFT disposed on the substrate as well as display electrode driven by the TFT, and an inner alignment layer contacting the TFT and the display electrode. Further, on the other side of the substrate, there is provided a liquid crystal layer having an outer alignment layer, and an outer polarizing plate arranged on the outermost side. Between the outer polarizing layer and the outer alignment plate, there is disposed a color filter having a transparent electrically conductive layer wherein a black-hued light-shielding layer (black matrix) and colored layers such as red-hued, green-hued, and blue-hued layers are formed on a transparent substrate.

For producing a color filter used in the liquid crystal display device, there are proposed a dyeing method, a pigment dispersion method, a printing method, an electrodeposition method, and a transfer method. In any of these known method, the precision in the arraying of the respective colored layers such as red-, green-, blue-, and black-hued layers and the light-shielding layer is of utmost importance. Above all, the black-hued light-shielding layer, or the black matrix needs to be positioned not only in registry with the counter-electrode substrate to avoid light leakage in the vicinity of the pixel electrode, but also without voids between the colored layers. Further, the black matrix significantly influences the picture quality such as contrast.

The black matrix is usually formed on a glass plate as a fine pattern of metal thin film. Materials for the metal thin film may be chromium, nickel, aluminum, or the like. The film may be formed by vacuum evaporation, sputtering, or vacuum film forming. The patterning of the metal thin film is carried out by a photolithographic method. Typical example of this method includes the steps of applying photoresist on a metal thin film and drying the same, irradiating ultraviolet rays via a photomask onto the photoresist to form a photoresist pattern, etching, and removing the resist. However, this method is costly due to the complexity of the process, which is reflected to the cost of the color filter itself to increase the same. Further, when the color filter having the black matrix formed with this metal thin film is used in a transparent type display, quality of the display is remarkably decreased due to its strong reflection upon irradiation with strong light since the reflection ratio of the surface of the metal thin film is high.

In order to overcome the above drawbacks, a black matrix formed of materials other than the metal thin film has been proposed. For example, Japanese Laid-open Patent Application No. 2-239204 discloses a method of producing a black matrix with a composition wherein carbon black is dispersed in a non-photosensitive polyimide resin. According to this method, a reliable black matrix with small light reflection can be obtained due to the high heat resistance of the polyimide resin used in the substrate. However, this method is also costly due to the complexity of the manufacturing process.

Alternatively, there is also proposed a method of forming a black matrix by photolithography, with a photocuring composition containing a black-hued coloring agent, a photocuring compound having carbon-carbon double bonds, and a photopolymerization initiator. In this case, as the black-hued coloring agent, a mixture of carbon black or other organic pigments may be used, but in order to achieve sufficient light-shielding performance, it is necessary to employ carbon black. For example, Japanese Laid-open Patent Application No. 4-63870 discloses a method of forming a black matrix with a composition obtained by dispersing carbon black and organic pigments in a photocuring composition having carbon-carbon double bonds, and further mixing with a photopolymerization initiator. However, this composition should contain the organic pigments in order to exhibit ultraviolet ray transmitting properties of about 400 nm for photocuring, and thus it is difficult to obtain sufficient light-shielding properties with low film thickness. This method has problems in that since the ultraviolet rays causes the carbon black to catch radicals generated by the photopolymerization initiator, photopolymerization is inhibited, and pixels are hard to be formed sufficiently with economical amount of light exposure, so that the patterns will be peeled off upon development.

In order to form a black matrix with carbon black, carbon black is introduced in an organic polymer compound or an organic solvent to prepare a dispersion, which is then used to form a black matrix on a transparent substrate. In the methods disclosed in the above patent applications, carbon black is used as a pigment. However, since the affinity of carbon black for other materials such as an organic polymer compound or an organic solvent is weaker than the agglomerating force between each particles thereof, it is extremely difficult to obtain a dispersion in homogeneous and stable state.

In order to overcome such problems, Japanese Laid-open Patent Application No. 5-67421 suggests a use of a composition containing carbon black grafted with a polymer compound and a photocuring compound. This method is expected to provide with ease a black matrix with superior photosensitivity, light-shielding properties, and stable dispersion. However, this method has some serious problems as follows.

According to the above patent application, it is disclosed that carbon black on which a polymer compound is grafted can be obtained either (A) by polymerizing radical polymerizing, anionic polymerizing, or cationic polymerizing monomers to graft a polymer compound on carbon black, or (B) by reacting reactive groups such as oxazoline groups or epoxy groups in the molecular of a polymer compound with carbon black to graft the polymer compound on carbon black. However, with the method (A), the grafting ratio is low so that the obtained grafted carbon black is not suitable for a black-hued pigment used for a black matrix of a color filter, and properties necessary for fabrication of a black matrix such as light-shielding properties and stability of dispersion of the black-hued composition cannot be given to the grafted carbon black. Further, due to the low grafting ratio, only a black matrix having high electrical conductivity can be obtained.

On the other hand, with the method (B), the grafting ratio can be increased so that the above properties are expected to be given to the grafted carbon black. However, in manufacturing a color filter by a pigment dispersion method using a photocuring compound, an alkaline developing solution is usually employed in an industrial scale in view of safety and operativity. With the photocuring composition used in the method (B), however, when the grafting ratio of the polymer compound becomes higher, the concentration of the grafted carbon black which is insoluble in alkali becomes too high to develop the black-hued coating film with alkali. The concentration of the grafted carbon black can be lowered by reducing its amount to be added to the black matrix, which, however, leads to remarkable deterioration in the light-shielding properties of the black matrix. Accordingly, the method (B) is also unsuitable for the fabrication of a color filter with high definition, and a grafted carbonaceous material which can be practically used for a color filter has not yet been developed.

DISCLOSURE OF THE INVENTION

It is an object of the present invention to provide a thermosetting composition and a photocuring composition which exhibit excellent light-shielding properties when used in a light-shielding layer of a color filter and the like, and superior dispersibility in an organic polymer compound and an organic solvent in use.

It is another object of the present invention to provide a photocuring composition which is soluble in water and in an alkali developing solution, which exhibits excellent photosensitivity in the manufacturing process of a color filter when it is used for a light-shielding layer thereof, and which can form a light-shielding layer with excellent light-shielding properties.

The inventors tried some modification of prior art methods, for example, the method (B) in the above mentioned Japanese Laid-open Patent Application No. 5-67421 to graft a polymer compound onto a carbon black by reacting carbon black with a polymer compound having in the molecule thereof reactive groups which are able to react with carbon material and acid groups such as carboxyl group which enables dispersion in water and development by alkali. However, in this method, the reactive groups in the polymer compound react not only with functional groups (probably acid groups) on the surface of carbon black, but also with its own acid groups to cause gelation, so that the obtained grafted carbon black cannot be used at all as a black-hued pigment for a black matrix.

By trial and error as above, the inventors have found that a black matrix with excellent light-shielding properties can easily be obtained by utilizing, in manufacturing a black matrix for a color filter with high definition, a thermosetting composition or a photocuring composition containing an acid group-containing carbon material obtained by a method wherein a polymer having in the molecule thereof a particular alkoxycarbonyl group is used, thereby completing the present invention.

Specifically, according to the present invention, there is provided a hardening composition comprising a carbonaceous material (1-1) and a thermosetting resin (1-2), said carbonaceous material (1-1) being obtained by reacting by contacting a carbon material (a) with a polymer (b) having in the molecule thereof at least one reactive group selected from the group consisting of aziridine group, oxazoline group, N-hydroxyalkylamido group, epoxy group, thioepoxy group, isocyanato group, hydroxyl group, amino group, vinyl group, acryl group, and methacryl group, and an alkoxycarbonyl group represented by the formula (1)

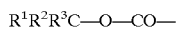  (1)

wherein $R^1$, $R^2$, and $R^3$ are the same or different groups, and each stands for a hydrogen atom or an organic residue selected from an alkyl group having 1 to 6 carbon atoms, a cycloalkyl group, having 5 to 8 carbon atoms, an alkylcycloalkyl group having 6 to 16 carbon atoms, or an aryl group having 6 to 16 carbon atoms, wherein at least two of R1, R2 and R3 stand for the organic residue which may be bonded cyclically with each other, wherein said hardening composition is thermosetting.

According to the present invention, there is also provided a hardening composition comprising a carbonaceous material (1-1), a photocuring compound (2-2) having at least one carbon-carbon double bond, and a photopolymerization initiator (2-3), said carbonaceous material (1-1) being obtained by reacting by contacting the carbon material (a) with the polymer (b).

PREFERRED EMBODIMENTS OF THE INVENTION

A carbonaceous material used in each of the hardening compositions of the present invention (occasionally referred to as a thermosetting composition and a photocuring composition, respectively, hereinafter) is obtained by reacting by contacting a carbon material (a) with a particular polymer (b).

There is no particular limitation to the carbon material (a), but it is preferred that the carbon material (a) has on the surface thereof at least one functional group selected from the group consisting of a quinone group, a carboxyl group, an urethane group, and a hydroxyl group. Specific examples of the carbon material (a) may include carbon black, aniline black, phenylene black, titan black, graphite, carbon fiber, and carbon whisker. Among these, carbon black is the most preferred because of its coloring ability and readiness of contacting reaction.

If the carbon black is employed as the carbon material (a), the preferable average particle size of the carbon black is not more than 1 µm, more preferably 0.01 to 0.5 µm, and most preferably 0.01 to 0.3 µm. Also, it is preferable that the carbon black has a pH value of not more than 7, more preferably 1 to 6, most preferably 1 to 4, as measured in the form of an aqueous solution by a method according to ISO-787-9, in terms of its readiness of the contacting reaction with the polymer (b). Examples of the carbon black may include furnace black, channel black, acetylene black, and lamp black. Among these, channel black is the most preferable in terms of its average particle size and pH value.

The specific reactive group which the polymer (b) has in the molecule thereof as the requisite group (simply referred to as "reactive group" hereinafter) has reactivity with the functional groups on the surface of the carbon material (a), and is at least one group selected from the group consisting of aziridine group, oxazoline group, N-hydroxyalkylamido group, epoxy group, thioepoxy group, isocyanato group, amino group, hydroxyl group, vinyl group, acryl group, and methacryl group. Among these, at least one group selected from the group consisting of aziridine group, oxazoline group, N-hydroxyalkylamido group, epoxy group, isocyanato group, and hydroxyl group is preferred, and at least one group selected from the group consisting of aziridine group, oxazoline group, N-hydroxyalkylamido group, epoxy group, and hydroxyl group is particularly preferred, in terms of its reactivity with the functional groups on the surface of the carbon material (a). It is particularly preferred to have as the reactive group a hydroxyl group alone or in combination with other reactive groups in the molecule of the polymer (b)

for readily heat-curing the carbonaceous material to be obtained when the carbonaceous material is mixed with various curing agents.

The specific alkoxycarbonyl group which the polymer (b) has in the molecule thereof as the other requisite group (simply referred to as "alkoxycarbonyl group" hereinafter) is represented by the above formula (1). In the formula (1), $R^1$, $R^2$, and $R^3$ are the same or different groups, and each stands for a hydrogen atom or an organic residue selected from a straight or branched, primary, secondary, or tertiary alkyl group having 1 to 6, preferably 1 to 3 carbon atoms such as methyl group, ethyl group, propyl group, butyl group, pentyl group, or hexyl group; a cycloalkyl group having 5 to 8, preferably 5 to 6 carbon atoms such as cyclopentyl group, cyclohexyl group, cycloheptyl group, or cyclooctyl group; an alkylcycloalkyl group having 6 to 16, preferably 6 to 9 carbon atoms such as methylcyclopentyl group, methylcyclohexyl group, dimethylcyclohexyl group, or ethylcyclohexyl group; or an aryl group having 6 to 16, preferably 6 to 10 carbon atoms such as phenyl group, methylphenyl group, or t-butylphenyl group, provided that at least two of $R^1$, $R^2$ and $R^3$ stand for the organic residue which may be bonded cyclically with each other. When two organic residues of $R^1$, $R 2$, and $R^3$ are cyclically bonded with each other, these two cyclically bonded organic residues are both divalent groups.

Specific examples of the alkoxycarbonyl group may include at least one group selected from the group consisting of t-butyloxycarbonyl group, 1,1-dimethylpropyloxycarbonyl group, 1-methyl-1-ethylpropyloxycarbonyl group, 1,1-diethylpropyloxycarbonyl group, 1,1-dimethylbutyloxycarbonyl group, 1,1-diethylbutyloxycarbonyl group, 1,1-dipropylbutyloxycarbonyl group, 1-methyl-1-ethylbutyloxycarbonyl group, 1-methyl-1-propylbutyloxycarbonyl group, 1-ethyl-1-propylbutyloxycarbonyl group, 1-phenylethyloxycarbonyl group, 1-methyl-1-phenylethyloxycarbonyl group, 1-phenylpropyloxycarbonyl group, 1-methyl-1-phenylpropyloxycarbonyl group, 1-ethyl-1-phenylpropyloxycarbonyl group, 1-phenylbutyloxycarbonyl group, 1-methyl-1-phenylbutyloxycarbonyl group, 1-ethyl-1-phenylbutyloxycarbonyl group, 1-propyl-1-phenylbutyloxycarbonyl group, 1-(4-methylphenyl)ethyloxycarbonyl group, 1-methyl-1-(4-methyl)phenylethyloxycarbonyl group, 1-(4-methylphenyl)propyloxycarbonyl group, 1-methyl-1-(4-methylphenyl)propyloxycarbonyl group, 1-ethyl-1-(4-methylphenyl)propyloxycarbonyl group, 1-(4-methylphenyl)butyloxycarbonyl group, 1-methyl-1-(4-methylphenyl)butyloxycarbonyl group, 1-ethyl-1-(4-methylphenyl)butyloxycarbonyl group, 1-propyl-1-(4-methylphenyl)butyloxycarbonyl group, 1-cyclopentylethyloxycarbonyl group, 1-methyl-1-cyclopentylethyloxycarbonyl group, 1-cyclopentylpropyloxycarbonyl group, 1-methyl-1-cyclopentylpropyloxycarbonyl group, 1-ethyl-1-cyclopentylpropyloxycarbonyl group, 1-cyclopentylbutyloxycarbonyl group, 1-methyl-1-cyclopentylbutyloxycarbonyl group, 1-ethyl-1-cyclopentylbutyloxycarbonyl group, 1-propyl-1-cyclopentylbutyloxycarbonyl group, 1-cyclohexylethyloxycarbonyl group, 1-methyl-1-cyclohexylethyloxycarbonyl group, 1-cyclohexylpropyloxycarbonyl group, 1-methyl-1-cyclohexylpropyloxycarbonyl group, 1-ethyl-1-cyclohexylpropyloxycarbonyl group, 1-cyclohexylbutyloxycarbonyl group, 1-methyl-1-cyclohexylbutyloxycarbonyl group, 1-ethyl-1-cyclohexylbutyloxycarbonyl group, 1-propyl-1-cyclohexylbutyloxycarbonyl group, 1-(4-methylcyclohexyl)ethyloxycarbonyl group, 1-methyl-1-(4-methylcyclohexyl)ethyloxycarbonyl group, 1-(4-methylcyclohexyl)propyloxycarbonyl group, 1-methyl-1-(4-methylcyclohexyl)propyloxycarbonyl group, 1-ethyl-1-(4-methylcyclohexyl)propyloxycarbonyl group, 1-(4-methylcyclohexyl)butyloxycarbonyl group, 1-methyl-1-(4-methylcyclohexyl)butyloxycarbonyl group, 1-ethyl-1-(4-methylcyclohexyl)butyloxycarbonyl group, 1-propyl-1-(4-methylcyclohexyl)butyloxycarbonyl group, 1-(2,4-dimethylcyclohexyl)ethyloxycarbonyl group, 1-methyl-1-(2,4-dimethylcyclohexyl)ethyloxycarbonyl group, 1-(2,4-dimethylcyclohexyl)propyloxycarbonyl group, 1-methyl-1-(2,4-dimethylcyclohexyl)propyloxycarbonyl group, 1-ethyl-1-(2,4-dimethylcyclohexyl)propyloxycarbonyl group, 1-(2,4-dimethylcyclohexyl)butyloxycarbonyl group, 1-methyl-1-(2,4-dimethylcyclohexyl)butyloxycarbonyl group, 1-ethyl-1-(2,4-dimethylcyclohexyl)butyloxycarbonyl group, 1-propyl-1-(2,4-dimethylcyclohexyl)butyloxycarbonyl group, cyclopentyloxycarbonyl group, 1-methylcyclopentyloxycarbonyl group, 1-ethylcyclopentyloxycarbonyl group, 1-propylcyclopentyloxycarbonyl group, 1-butylcyclopentyloxycarbonyl group, cyclohexyloxycarbonyl group, 1-methylcyclohexyloxycarbonyl group, 1-ethylcyclohexyloxycarbonyl group, 1-propylcyclohexyloxycarbonyl group, 1-butylcyclohexyloxycarbonyl group, 1-pentylcyclohexyloxycarbonyl group, 1-methylcycloheptyloxycarbonyl group, and 1-methylcyclooctylcarbonyl group.

There is no particular limitation to the number average molecular weight (employing polystyrene as a standard sample) of the polymer (b), but the preferable number average molecular weight thereof is 1000 to 100000, more preferably 5000 to 30000. Also, there is no limitation to the contents of the aforementioned specific reactive group and the aforementioned specific alkoxycarbonyl group in the molecule of the polymer (b) but the preferable content of the specific reactive group is 1 to 500 mmol per 100 g of the polymer (b), and the preferable content of the specific alkoxycarbonyl group is 1 to 500 mmol per 100 g of the polymer (b).

The polymer (b) may be prepared by copolymerization of a monomer having the aforementioned specific reactive group with a monomer having the aforementioned specific alkoxycarbonyl group.

Examples of the monomer having the specific reactive group may include aziridine group-containing polymerizable monomers represented by the formulae such as:
$CH_2=C(CH_3)-NHCO-A^2-A^1$, $CH_2=CH-COO-CH_2CH_2-A^1$, $CH_2=C(CH_3)-COO-CH_2CH_2-A^1$, $CH_2=CH-COO-CH_2CH_2-A^3$, $CH_2=C(CH_3)-COO-CH_2CH_2-A^3$, $CH_2=CH-COO-CH_2CH_2-A^4$, $CH_2=C(CH_3)-COO-CH_2CH_2-A^4$, $CH_2=CH-COO-CH_2CH_2-A^5$, $CH_2=C(CH_3)-COO-CH_2CH_2-A^5$, $CH_2=CH-A^1$, $CH_2=CH-CH_2-A^1$, $CH_2=CH-A^2-A^1$, $CH_2=C(CH_3)-A^2-A^1$, $CH_2=CH-A^2-CH_2-A^1$, $CH_2=C(CH_3)-A^2-CH_2-A^1$, $CH_2=CH-A^2-CH_2CH_2-A^1$, $CH_2=C(CH_3)-A^2-CH_2CH_2-A^1$, $CH_2=CH-NHCO-A^2-A^1$, $CH_2=CH-COO-CH(CH)_3-CH_2-A^1$, $CH_2=C(CH_3)-COO-CH(CH)_3-CH_2-A^1$, $CH_2=CH-COO-(CH_2CH_2O)n-CH_2CH_2O-A^1$, $CH_2=C(CH_3)-COO-(CH_2CH_2O)$ n—CH₂CH₂O—A¹, CH₂=CH—COO—(CH₂CH₂O)n—CO—CH₂CH₂O—A¹, CH₂=C(CH₃)—COO—(CH₂CH₂O)n—CO—CH₂CH₂O—A¹, CH(CH₂CH₂O—CO—CH=CH₂)₂—CH₂O—CO—CH₂CH₂—A¹, CH(CH₂CH₂O—CO—C(CH₃)=CH₂)₂—CH₂O—CO—CH₂CH₂—A¹, CH₃CH₂—C(CH₂O—CO—CH=CH₂)₂—CH₂O—CO—CH₂CH₂—A¹, CH₃CH₂—C(CH₂O—CO—C(CH₃)=CH₂)₂—CH₂O—CO—CH₂CH₂—A¹, CH₂=CH—CO—A¹, CH₂=C(CH₃)—CO—A¹, CH₂=CH—OCO—A¹, CH₂=C(CH₃)—OCO—A¹, CH₂=CH—SO₂—A¹, CH₂=C(CH₃)—SO₂—A¹, CH₂=CH—NHCO—A¹, CH₂=C(CH₃)—NHCO—A¹, CH₂=CH—NHCS—A¹, CH₂=C(CH₃)—NHCS—A¹, CH₂=CH—CH₂—OCO—A¹, CH₂=CH—CO—A³, CH₂=C(CH₃)—CO—A³, CH₂=CH—CO—A⁴, CH₂=C(CH₃)—CO—A⁴, CH₂=CH—CO—A⁵, CH₂=C(CH₃)—CO—A⁵, CH₂=CH—A²—SO₂—A¹, CH₂=C(CH₃)—A²—SO₂—A¹, CH₂=CH—A²—NHCO—A¹, CH₂=C(CH₃)—A²—NHCO—A¹, CH₂=CH—CONH—A²—SO₂—A¹, CH₂=C(CH₃)—CONH—A²—SO₂—A¹, CH₂=CH—COO—CH₂CH₂—NHCO—A¹, CH₂=C(CH₃)—COO—CH₂CH₂—NHCO—A¹, or (CH₂=CH—CH₂NH)₂—PO—A¹ wherein A¹ stands for an aziridine group, A² stands for a 1,4-substituted phenylene group, A³ stands for a 2-methylaziridine group, A⁴ stands for a 2,2-dimethylaziridine group, A⁵ stands for a 2-ethylaziridine group, and n is 0 or an integer of 1 to 20;

oxazoline group-containing polymerizable monomers such as 2-vinyl-2-oxazoline, 2-vinyl-4-methyl-2-oxazoline, 2-vinyl-5-methyl-2-oxazoline, 2-vinyl-4-ethyl-2-oxazoline, 2-vinyl-5-ethyl-2-oxazoline, 2-isopropenyl-2-oxazoline, 2-isopropenyl-4-methyl-2-oxazoline, 2-isopropenyl-5-methyl-2-oxazoline, 2-isopropenyl-4-ethyl-2-oxazoline, 2-isopropenyl-5-ethyl-2-oxazoline, or 2-isopropenyl-4,5-dimethyl-2-oxazoline;

N-hydroxyalkylamido group-containing polymerizable monomers such as N-hydroxymethylacrylamide, N-hydroxyethylacrylamido, N-hydroxybutylacrylamido, N-hydroxyisobutylacrylamido, N-hydroxy-2-ethylhexylacrylamido, N-hydroxycyclohexylacrylamido, N-hydroxymethylmethacrylamido, N-hydroxyethylmethacrylamido, N-hydroxybutylmethacrylamido, N-hydroxyisobutylmethacrylamido, N-hydroxy-2-ethylhexylmethacrylamido, or N-hydroxycyclohexylmethacrylamido;

epoxy group-containing polymerizable monomers represented by the formulae such as
CH₂=CH—A⁶, CH₂=CH—A²—A⁶, CH₂=CH—A²—CH₂—A⁶, CH₂=CH—A²—CH₂—CH₂—A⁶, CH₂=C(CH₃)—A²—A⁶, CH₂=C(CH₃)—A²—CH₂—A⁶, CH₂=C(CH₃)—A²—CH₂—CH₂—A⁶, CH₂=CH—NHCO—A²—A⁶, CH₂=C(CH₃)—NHCO—A²—A⁶, CH₂=CH—A²—O—(CH(R⁴)CHO)n—CH₂—A⁶, CH₂=C(CH₃)—A²—O—(CH(R⁴)CHO)n—CH₂—A⁶, CH₂=CH—COO—(CH(R⁴)CHO)n—CH₂—A⁶, or CH₂=C(CH₃)—COO—(CH(R⁴)CHO)n—CH₂—A⁶, wherein R⁴ stands for a hydrogen atom or a methyl group, A² stands for a 1,4-substituted phenyl group, A⁶ stands for an epoxy group, and n is 0 or an integer of 1 to 20;

thioepoxy group-containing polymerizable monomers represented by the formulae such as CH₂=CH—A⁷, CH₂=CH—A²—A⁷, CH₂=CH—A²—CH₂—A⁷, CH₂=CH—A²—CH₂—CH₂—A⁷, CH₂=C(CH₃)—A²—A⁷, CH₂=C(CH₃)—A²—CH₂—A⁷, CH₂=C(CH₃)—A²—CH₂—CH₂—A⁷, CH₂=CH—NHCO—A²—A⁷, CH₂=C(CH₃)—NHCO—A²—A⁷, CH₂=CH—A²—O—(CH(R⁴)CHO)n—CH₂—A⁷, CH₂=C(CH₃)—A²—O—(CH(R⁴)CHO)n—CH₂—A⁷, CH₂=CH—COO—(CH(R⁴)CHO)n—CH₂—A⁷, or CH₂=C(CH₃)—COO—(CH(R⁴)CHO)n—CH₂—A⁷, wherein R⁴ stands for a hydrogen atom or a methyl group, A² stands for a 1,4-substituted phenyl group, A⁷ stands for a thioepoxy group, and n is 0 or an integer of 1 to 20;

isocyanato group-containing polymerizable monomers represented by the formulae such as
CH₂=CH—COO—(CH₂)n—N=C=O, CH₂=C(CH₃)—COO—(CH₂)n—N=C=O, CH₂=CH—COO—(CH₂)n—OCONH—A⁸, CH₂=C(CH₃)—COO—(CH₂)n—OCONH—A⁸, CH₂=CH—COO—(CH₂)n—OCONH—A⁹, or CH₂=C(CH₃)—COO—(CH₂)n—OCONH—A⁹, wherein A⁸ and A⁹ stand for a group represented by the formula below, respectively, and n is 0 or an integer of 1 to 20;

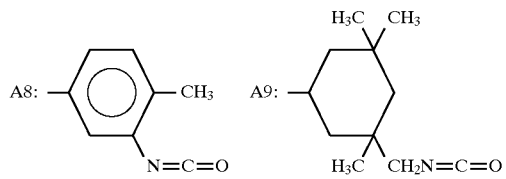

hydroxyl group-containing polymerizable monomers represented by the formulae such as
CH₂=CH—COO—CH₂CH₂—OH, CH₂=C(CH₂)—COO—CH₂CH₂—OH, CH₂=CH—COO—CH₂CH(OH)CH₂Cl, CH₂=C(CH₂)—COO—CH₂CH(OH)CH₂Cl, CH₂=CH—COO—CH(CH₂)CH₂—OH, CH₂=C(CH₂)—COO—CH(CH₂)CH₂—OH, CH₂=CH—COO—CH₂CH(OH)CH₂, CH₂=C(CH₂)—COO—CH₂CH(OH)CH₂, CH₂=CH—COO—CH₂CH₂CH₂—OH, CH₂=C(CH₂)—COO—CH₂CH₂CH₂—OH, CH₂=CH—COO—CH₂CH(OH)CH₂—OH, CH₂=C(CH₂)—COO—CH₂CH(OH)CH₂—OH, CH₂=CH—COO—CH₂CH(OH)CH₂CH₂, CH₂=C(CH₂)—COO—CH₂CH(OH)CH₂CH₂, CH₂=CH—COO—CH₂CH₂CH₂CH₂—OH, CH₂=C(CH₂)—COO—CH₂CH₂CH₂CH₂—OH, CH₂=CH—COO—CH₂CH₂—O—CH₂CH₂—OH, CH₂=C(CH₂)—COO—CH₂CH₂—O—CH₂CH₂—OH, CH₂=CH—COO—CH₂CH₂—OCO—A¹⁰—COO—CH₂CH(OH)CH₂, or CH₂=CH—COO—CH₂CH(OH)—CH₂O—A¹¹, wherein A¹⁰ stands for a 1,2-substituted phenyl group, A¹¹ stands for a phenyl group;

and amino group-containing polymerizable monomers such as 4-vinylaniline or allylamine, all of which may be used alone or in mixture.

On the other hand, the monomer having the specific alkoxycarbonyl group may be t-butyl (meth)acrylate, t-pentyl (meth)acrylate, 1-phenylethyl(meth)acrylate, triethylmethyl (meth)acrylate, or mixtures thereof.

In order to make the polymer (b) have higher molecular weight, in addition to the monomers having the specific reactive group and the monomers having the specific alkoxycarbonyl group, other monomers which do not contribute to the reaction with the carbon material (a) may be copolymerized simultaneously. Examples of such monomers may include, for example, alkyl (meth) acrylate having 1 to 18 carbon atoms such as methyl (meth) acrylate, ethyl (meth)acrylate, butyl (meth)acrylate, isobutyl (meth) acrylate, hexyl (meth)acrylate, lauryl (meth)acrylate, cetyl acrylate, stearyl acrylate, cyclohexyl (meth)acrylate, benzyl (meth)acrylate, isobornyl (meth)acrylate, 2-methoxyethyl (meth)acrylate, 3-methoxybutyl (meth)acrylate, ethylcarbitol (meth)acrylate, phenoxyethyl (meth)acrylate, trifluoroethyl (meth) acrylate, tetrafluoropropyl (meth)acrylate, hexafluoropropyl (meth)acrylate, octafluoropentyl (meth) acrylate, heptadecafluorodecyl (meth)acrylate, trimethylsiloxyethyl (meth)acrylate, tetrahydrofurfuryl (meth) acrylate, phenoxypolyethylene glycol (meth)acrylate, methoxytripropylene glycol (meth)acrylate, or methoxytriethylene glycol (meth)acrylate; N-substituted maleimide such as N-cyclohexylmaleimide, N-phenylmaleimide, N-(2-chlorophenyl)maleimide, or N-laurylmaleimide; styrene monomers such as styrene, o-methylstyrene, m-methylstyrene, p-methylstyrene, p-methoxystyrene, p-tert-butylstyrene, p-phenylstyrene, o-chlorostyrene, m-chlorostyrene, or p-chlorostyrene; ethylene, propylene, butylene, vinyl chloride, vinyl acetate, acrylonitrile, N-vinylpyrrolidone, or mixtures thereof.

The polymer (b) may be prepared by solution polymerization, suspension polymerization, emulsion polymerization, precipitation polymerization, or bulk polymerization. Among these, the solution polymerization is particularly preferred. When the solution polymerization is employed, an organic solvent such as isopropyl alcohol, methyl ethyl ketone, hexane, butyl cellosolve, diethylene glycol dimethyl ether, or mixtures thereof is usually employed as a solvent for the reaction. The conditions such as temperature and duration for the reaction may suitably be selected depending on the material monomers to be used so that, for example, the number average molecular weight is in the aforementioned preferred range.

The carbonaceous material used in the hardening composition of the present invention is produced by reacting by contacting the carbon material (a) with the polymer (b).

In the contacting reaction of the carbon material (a) with the polymer (b), when first the carbon material (a) is contacted with the polymer (b), the polymer (b) covalently bonds onto the surface of the carbon material (a) by heating, and then an elimination reaction is proceeded wherein the protective group $R^1R^2R^3C-$ is eliminated from the alkoxycarbonyl group represented by the formula (1) in the polymer (b) to give a carboxyl group.

In the above contacting reaction, the mixing ratio of the carbon material (a) to the polymer (b) is preferably 1:0.5 to 1:10, more preferably 1:1 to 1:5 by weight.

The conditions for the contacting reaction are not particularly limited since they may vary depending on the type of the reactive group in the polymer (b). However, the contacting temperature is usually 30 to 230° C., preferably 70° to 180° C. For example, when polymer (b) having an epoxy group as the reactive group is employed, the contacting temperature is preferably 80° to 200° C., more preferably 100° to 180° C. When polymer (b) having an oxazoline group as the reactive group is employed, the contacting temperature is preferably 30° to 200° C., more preferably 70° to 180° C. When polymer (b) having a hydroxyl group as the reactive group is employed, the contacting temperature is preferably 60° to 230° C., more preferably 100° to 210° C. The duration of contacting may vary depending on the way of contacting between the carbon material (a) and the polymer (b) to be used, but is preferably 1 minute to 24 hours, more preferably 3 minutes to 5 hours.

The contacting reaction may be effected, for example, by preparing a mixture either by dissolving the carbon material (a) and the polymer (b) in a solvent which does not affect the reaction such as isopropyl alcohol, methyl ethyl ketone, hexane, or mixtures thereof, or preferably by contacting the carbon material (a) and the polymer (b) in the absence of any solvent. In this case, the reaction for the above mentioned covalent bonding is promoted in the presence of an acid catalyst such as sulfonic acid, hydrochloric acid, boron fluoride compounds, or mixtures thereof. However, since each of the carbon material (a) is acid, such acid catalyst is not always necessary. The contacting reaction is usually carried out by stirring and mixing the mixture. In order to improve the reaction ratio in contacting the carbon material (a) and the polymer (b), it is preferred to employ a crusher such as a sand mill, a roll mill, an attriter, a ball mill, or a kneader for stirring and mixing the mixture. In this reaction, polymer component other than the polymer (b), or monomers may be present in the reaction system.

The contacting reaction is preferably carried out under the conditions to eliminate the protective group $R^1R^2R^3C-$ from the alkoxycarbonyl group represented by the formula (1) in the polymer (b) to give a carboxyl group.

The specific examples of the contacting reaction may include: (i) effecting consecutively the series of reaction from contacting the carbon material (a) with the polymer (b) until eliminating $R^1R^2R^3C-$ to give a carboxyl group; (ii) first contacting the carbon material (a) with the polymer (b) at a suitable temperature, and then eliminating $R^1R^2R^3C-$ to give a carboxyl group in the same batch; or (iii) contacting the carbon material (a) with the polymer (b) at a suitable temperature, dispersing the obtained reaction product in an organic solvent, and then eliminating $R^1R^2R^3C-$ in the presence of an acid or an alkali catalyst to give a carboxyl group.

In the method (i), a suitable temperature for contacting is 30° to 250° C., preferably 50° to 200° C. For example, when polymer (b) having a epoxy group as the reactive group is employed, the contacting temperature is preferably 80° to 200° C., more preferably 100° to 180° C. When polymer (b) having an oxazoline group as the reactive group is employed, the contacting temperature is preferably 30° to 200° C., more preferably 70° to 180° C. When polymer (b) having a hydroxyl group as the reactive group is employed, the contacting temperature is preferably 60° to 230° C., more preferably 100° to 210° C. The duration of contacting is usually 1 minute to 10 hours, preferably 10 minutes to 5 hours.

In the method (ii), the suitable contacting temperature is preferably 30° to 110° C., and the temperature for the subsequent elimination of $R^1R^2R^3C-$ to give a carboxyl group is preferably 110° to 200° C.

In the method (iii), the suitable contacting temperature is preferably 30° to 200° C., and the temperature for the subsequent elimination of $R^1R^2R^3C-$ to give a carboxyl group is preferably 70° to 200° C. The organic solvent may be isopropyl alcohol, methyl ethyl ketone, hexane, butyl cellosolve, diethylene glycol dimethyl ether, or triethylene glycol dimethyl ether. The acid catalyst may be sulfuric acid, hydrochloric acid, acetic acid, or p-toluenesulfonic acid, and the alkaline catalyst may be sodium hydroxide, potassium hydroxide, triethylamine, or aqueous ammonia. Further, the duration of the contacting reaction in the method (iii) is usually 5 minutes to 10 hours, preferably 10 minutes to 5 hours, and the duration of the reaction for eliminating $R^1R^2R^3C$— to give a carboxyl group is usually about 30 minutes to 5 hours.

The content of the carboxyl group in the carbonaceous material obtained by the above contacting reaction is preferably 10 to 500 mmol, more preferably 20 to 300 mmol per 100 g of the carbonaceous material. If the content of the carboxyl group is less than 10 mmol, the electrical resistance of the obtained carbonaceous material becomes low, and the dispersion of the carbonaceous material in water upon utilizing it for an aqueous ink becomes difficult, thus not being preferable. If the content of the carboxyl group is more than 500 mmol, the moisture resistance of the carbonaceous material is lowered, thus not being preferable.

Further, it is preferred that the carbonaceous material has a hydroxyl group in the molecule thereof for ready curing of the hardening composition when the carbonaceous material is mixed with a various kinds of curing agents. The hydroxyl group may be the hydroxyl group in the molecule of the polymer (b) which remains after the contacting reaction, or may be a hydroxyl group added to the carbonaceous material after the contacting reaction.

The above mentioned carbonaceous material shows low conductivity. The volume resistivity thereof is usually not less than $1 \times 10^8 \Omega \cdot cm$, preferably $1 \times 10^{12}$ to $1 \times 10^{30} \Omega \cdot cm$.

The thermosetting composition of the present invention contains a thermosetting resin as a requisite component in addition to the carbonaceous material. The thermosetting resin is a compound having functional groups which enable the compound to be cured by heat. Examples of the functional group which enables the compound to be cured by heat may include an epoxy group; an acid anhydride group such as a succinic anhydride group or a phthalic anhydride group; an alkenyl group; a vinyl group; a propenyl group; a hydroxyl group; an aldehyde group; or an acid group such as a carboxyl group or a sulfonic acid group. Examples of the thermosetting resin may include acrylic resin, polyester resin, unsaturated fatty oil resin, polybutadiene resin, epoxy resin, or mixtures thereof. For using the thermosetting composition of the present invention for an aqueous ink or the like, an acid group such as a carboxyl group is introduced into the thermosetting resin, and the obtained compound is neutralized with a basic material such as triethylamine, diethylamine, dimethylethanolamine, ammonia, or mixtures thereof, thereby obtaining a composition which can be dissolved or dispersed in water.

In the thermosetting composition of the present invention, the mixing ratio of the carbonaceous material and the thermosetting resin may suitably be selected depending on the usage, but is preferably 1:0.1 to 1:8, more preferably 1:0.4 to 1:3 by weight.

The carbonaceous material constituting the thermosetting composition of the present invention may have functional groups which enable the compound to be cured by heat on its polymer chain. In this case, exceptionally, the thermosetting resin does not have to be used.

Upon using the thermosetting composition of the present invention, a curing agent may suitably be added. Examples of such curing agent may include, for example, melamine, benzoguanamine, urea, or derivatives of these compounds; amino resins such as melamine resin or urea resin; phenol resin; blocked isocyanates; or mixtures thereof. For using the thermosetting composition of the present invention for a black matrix of a color filter, a curing agent which effects curing at relatively low temperature such as at 90° to 140° C. is preferably used. The amount of the curing agent to be added is preferably 0 to 50 parts by weight, more preferably 5 to 30 parts by weight based on 100 parts by weight of the total of the carbonaceous material and the thermosetting resin.

The thermosetting composition of the present invention may be admixed with a coloring agent. The coloring agent may be a dye and/or a pigment. Specific examples of the coloring agent may include vanadium trioxide, manganese dioxide, molybdenum disulfide, triiron tetraoxide, Aniline Black, Sudan Black B, Acid Black 1 and 52, Fast Black K Salt, Nigrosin, or mixtures thereof. More specifically, the dyes and pigments shown in "COLOR INDEX", third edition, may be employed. The amount of the coloring agent to be added is preferably 0 to 40 parts by weight, more preferably 5 to 30 parts by weight based on 100 parts by weight of the total of the carbonaceous material and the thermosetting resin.

The thermosetting composition of the present invention may further be admixed with various assistant agents such as a dispersion assistant agent for dyes and pigments, a levelling agent for improving the smoothness of the film, a viscosity adjustment agent, or an anti-foaming agent.

When the thermosetting composition of the present invention is used for producing a color filter, the thermosetting composition of the present invention is coated on a substrate such as a glass plate. In this case, it is preferred to dilute the thermosetting composition with an organic solvent before use for improving the easiness of coating on the substrate. Examples of the organic solvent may include alkyl cellosolves such as methyl cellosolve, ethyl cellosolve, propyl cellosolve, isopropyl cellosolve, or butyl cellosolve, or acetates of these alkyl cellosolves; alkylene glycols such as ethylene glycol, diethylene glycol, or propylene glycol, or alkyl ethers or alkyl ether acetates of these alkylene glycols; cyclohexanone, diethyleneglycol dimethyl ether, toluene, xylene, or mixtures thereof. Upon diluting the thermosetting composition with the organic solvent, it is preferred to adjust the solid content to be 5 to 80% by weight. The dilution with the organic solvent is usually carried out in a mixer or a dispersing device. The obtained liquid mixture may be filtered, if desired, for the purpose of removing coarse particles or foreign substances in the mixture. The filtration may be performed under pressure using a filter of a membrane, a surface, or a depth type having the pore size of not more than 1 μm, preferably not more than 0.5 μm.

For producing a black matrix of a color filter with the thermosetting composition of the present invention, an offset printing, an intaglio printing, a relief printing, or a photolithographic method may be employed. Among these, a photolithographic method is preferred in terms of precision. In the photolithographic method to be described below, a step of developing the thermosetting composition with an alkali developing solution is included, so that the thermosetting composition is required to be soluble in an alkali developing solution. At this point, the thermosetting composition of the present invention containing the carbonaceous material having the carboxyl group has an advantage in that it can be developed with alkali even when it is charged with a great amount of black-hued pigment. This is a significant difference from the conventional grafted carbonaceous material having little acid.

Examples of the process of producing a black matrix using the thermosetting composition of the present invention by a photolithographic method are illustrated below.

Method 1: The thermosetting composition of the present invention is coated on a support body such as a glass plate, a polycarbonate plate, a silicone wafer, a plastic sheet, or paper by a coating method using a bar coater, a spin coater, or a roll coater, or such method as spray coating, dipping, gravure printing, or screen printing, and is dried to obtain a black-hued coating film. Then photoresist which can be developed with alkali is coated over the obtained black-hued coating film in the same way as above, dried, and then exposed to light through a predetermined photomask. After that, the desired portions of the photoresist film are developed with an alkali developing solution, and simultaneously the black-hued coating film portions under the resist portions which have been developed and removed are also removed. After this process, the black-hued coating film is heated at a temperature not deteriorating the photoresist to cure the black-hued coating film for giving resistance against the developing solution of the resist, and then the photoresist is developed and removed to obtain the desired black matrix.

Method 2: Photoresist is coated on a substrate, and desired portions of the resist are developed and removed by a photolithography method. After that, the thermosetting composition of the present invention is coated by a spin coater or the like to form a thin film thereon, and the obtained black-hued coating film was cured by heating at a low temperature enabling the subsequent removal of the photoresist to give resistance to the black-hued coating film against the developing solution of the resist. Finally, the remaining resist and the black-hued thin film on the resist are removed together to form a black matrix. The above mentioned photoresist may either be positive or negative resist. Preferable film thickness of the black matrix is usually 0.2 to 5.0 μm.

The photocuring composition of the present invention contains as requisite components a photocuring compound having at least one carbon-carbon double bond (simply referred to as "photocuring compound" hereinbelow) and a photopolymerization initiator in addition to the carbonaceous material.

In the photocuring composition of the present invention, the above mentioned particular carbonaceous material is used as a carbonaceous material. The content thereof is preferably 20 to 80% by weight of the total weight of the composition.

The above mentioned carbonaceous material may be used as it is, but in order to improve photocuring property and durability of the coated film, it may be modified to introduce a carbon-carbon double bond causing photocuring, thereby giving photocuring property to the carbonaceous material. Such carbonaceous material given the photocuring property may be produced by adding glycidyl (meth) acrylate to a portion of the carboxyl group of the carbonaceous material. When the carbonaceous material having the photocuring property is used, the photocuring compound constituting the requisite component of the photocuring composition of the present invention does not have to be used exceptionally.

The average molecular weight of the photocuring compound as the requisite component of the photocuring composition of the present invention is preferably not less than 1000 due to the extremely fast photopolymerization rate. The content of the photocuring compound is preferably 30 to 80% by weight of the total weight of the composition in order to effect the photopolymerization efficiently.

Examples of the photocuring compound may include esters of acrylic acid or methacrylic acid as well as monohydric or polyhydric alcohols such as ethylacrylate, butylacrylate, hydroxyethylacrylate, hydroxyethylmethacrylate, ethylene glycol dimethacrylate, pentaerythritol triacrylate, pentaerythritol trimethacrylate, dipentaerythritol hexaacrylate, or dipentaerythritol hexamethacrylate; polyester (meth)acrylate obtained by reacting (meth)acrylic acid with polyester prepolymer prepared by condensing polyhydric alcohol and monobasic or polybasic acid; polyurethane (meth)acrylate obtained by reacting a compound having a polyol group with a compound having two isocyanato groups, followed by reacting with (meth) acrylic acid; epoxy (meth)acrylate obtained by reacting (meth) acrylic acid with an epoxy resin such as bisphenol A epoxy resin, bisphenol F epoxy resin, novolak epoxy resin, polycarboxylic acid polyglycidyl ester, polyolpolyglycidyl ether, aliphatic epoxy resin, alicyclic epoxy resin, amine epoxy resin, triphenolmethane epoxy resin, or dihydroxybenzene epoxy resin; or mixtures thereof.

The photocuring compound preferably has acid groups such as a carboxyl group in the molecule thereof for facilitating development with alkali. Examples of the photocuring compound having both the carboxyl group and the carbon-carbon double bond may include carboxyl group-containing epoxy (meth)acrylate obtained by reacting (meth)acrylic acid with an epoxy group-containing resin such as bisphenol A epoxy resin, bisphenol F epoxy resin, novolak epoxy resin, polycarboxylic acid polyglycidyl ester, polyolpolyglycidyl ether, aliphatic epoxy resin, alicyclic epoxy resin, amine epoxy resin, triphenolmethane epoxy resin, or dihydrobenzene epoxy resin to obtain a hydroxyl group-containing resin, which is further reacted with an acid anhydride such as succinic anhydride, tetrahydrophthalic anhydride, hexahydrophthalic anhydride, or methylhexahydrophthalic anhydride; a compound half-esterified by reacting maleic anhydride portion of a copolymer of maleic anhydride and monomers such as ethylene, propylene, isobutylene, styrene, vinylphenol, acrylic acid, acrylate, or acrylamido with acrylate having an alcoholic hydroxyl group such as hydroxyethyl acrylate or (meth)acrylate having an epoxy group such as glycidylmethacrylate; or a compound obtained by reacting a hydroxyl group in a ternary copolymer of an acrylate having an alcoholic hydroxyl group such as acrylic acid, acrylate, or hydroxyethylacrylate with acrylic acid. These compounds may be used alone or in mixture.

Examples of the photopolymerization initiator as the requisite component of the photocuring composition of the present invention may include benzyl, benzoin ether, benzoin isobutyl ether, benzoin isopropyl ether, benzophenone, benzoylbenzoic acid, methyl benzoylbenzoic acid, 4-benzoyl-4'-methyldiphenylsulfide, benzylmethylketal, dimethylaminomethylbenzoate, 2-n-butoxyethyl-4-dimethylaminobenzoate, isoamyl p-dimethylaminobenzoate, 3,3'-dimethyl-4-methoxybenzophenone, methyoxybenzoylformate, 2-methyl-1-(4-5 (methylthio)phenyl)-2-morpholinopropane-1-one, (IRGACURE 907™) 2-benzyl-2-dimethylamino-1-(4-morpholinophenyl)-butane-1-one, 1-(4-dodecylphenyl)-2-hydroxy-2-methylpropane-1-one, 1-hydroxycyclohexylphenylketone, 2-hydroxy-2-methyl-1-phenylpropane-1-one, 1-(4-isopropylphenyl)-2-hydroxy-2-methylpropane-1-one, 2-chlorothioxanthone, 2,4-diethylthioxanthone, 2,4-dipropylthioxanthone, 2,4-dimethylthioxanthone, isopropylthioxanthone, 1-chloro-4-propoxythioxanthone, and mixtures thereof. The mixing ratio of the photopolymerization initiator to the photocuring compound is preferably 0.005:1 to 0.3:1, more preferably 0.02:1 to 0.15:1 by weight.

According to the present invention, a hexaarylbisimidazole compound or a hydrogen donor compound may be used together with the photopolymerization initiator. The mixing ratio of these compounds to the photocuring compound is preferably 0.005:1 to 0.3:1, more preferably 0.02:1 to 0.15:1 by weight. Specific examples of these compounds are as disclosed in U.S. Pat. No. 3,784,557 and European Patent Application EP 24629A. Hexaarylbisimidazole compound such as 2,2'-bis(o-chlorophenyl)-4,4', 5,5'-tetraphenylbisimidazolyl, 2,2'-bis(o-chlorophenyl)-4,4',5,5'-tetra-(p-methoxyphenyl)-bisimidazolyl, or mixtures thereof, is particularly preferred due to its stability and sensitivity.

The hydrogen donor compound may be an aromatic mercaptan compound, an aromatic amine compound, or mixtures thereof. Among the aromatic mercaptan hydrogen donor compounds, compounds having a benzene or a heterocyclic ring with one or two mercapto groups exhibit excellent properties. In this case, when the compound has two substituted mercapto groups, either of the mercapto groups may be substituted by an alkyl group, an aralkyl group, or a phenyl group, or the compound may be a dimer in the form of disulfide. Preferred examples of the aromatic mercaptan compound may include 2-mercaptobenzothiazole, 2-mercaptobenzoxazole, or mixtures thereof. Among the aromatic amine hydrogen donor compound, compounds having a benzene or a heterocyclic ring with one or two amino groups exhibit excellent properties. In this case, at least one hydrogen atom in the amino group may be substituted by an alkyl group or a substituted alkyl group. When the compound has two amino groups, either of the amino groups may be substituted by a carboxyl group, an alkoxycarbonyl group, a substituted alkoxycarbonyl group, a phenoxycarbonyl group, a substituted phenoxycarbonyl group, or a nitrile group.

The photocuring composition of the present invention may further be admixed with a film forming polymer binder, such as polymethacrylate or partially hydrolyzed compound thereof, polyvinyl acetate or hydrolyzed compound thereof, polystyrene, polyvinylbutyral, polychloroprene, polyvinylchloride, chlorinated polyethylene, chlorinated polypropylene, polyvinyl pyrrolidone, a copolymer of styrene and maleic anhydride or half ester thereof, or a copolymer of copolymerizable monomers selected from (meth) acrylic acid, (meth)acrylate, acrylamide, or acrylonitrile. The amount of the film forming polymer binder to be added is preferably 0 to 50% by weight, more preferably 3 to 30% by weight of the total weight of the photocuring composition.

The photocuring composition of the present invention may further be admixed with an epoxy compound for improving heat resistance. The epoxy compound is advantageous in improving heat resistance by thermally reacting with and cross-linking with the carboxyl group-containing carbonaceous material and the carboxyl group-containing photocuring compound. Examples of the epoxy compound may include bisphenol A epoxy resin, bisphenol F epoxy resin, novolak epoxy resin, polycarboxylic acid polyglycidyl ester, polyolpolyglycidyl ether, aliphatic or alicyclic epoxy resin, amine epoxy resin, triphenolmethane epoxy resin, or dihydrobenzene epoxy resin. The mixing ratio of the epoxy compound to the photocuring compound is preferably not more than 0.3:1, more preferably not more than 0.15:1 by weight.

In producing a color filter with the photocuring composition of the present invention, the photocuring composition may be diluted with an organic solvent before use in order to improve easiness of coating on the substrate such as a glass plate. The organic solvent may be an alkyl cellosolve such as methyl cellosolve, ethyl cellosolve, propyl cellosolve, isopropyl cellosolve, or butyl cellosolve, or acetates of these alkyl cellosolves; an alkylene glycol such as ethylene glycol, diethylene glycol, or propylene glycol, or alkyl ethers or alkyl ether acetates of these alkylene glycols; cyclohexanone, diethyleneglycol dimethyl ether, toluene, xylene, or mixtures thereof. Upon diluting the photocuring composition with the organic solvent, it is preferred to adjust the solid content to be 5 to 80% by weight. The dilution with the organic solvent is usually carried out in a mixer or a dispersing device. The obtained liquid mixture may be filtered, if desired, for the purpose of removing coarse particles and foreign substances in the mixture. The filtration may be performed under pressure using a filter of a membrane, a surface, or a depth type having the pore size of not more than 1 $\mu$m, preferably not more than 0.5 $\mu$m.

An example of the process of producing a black matrix of a color filter with the photocuring composition of the present invention is illustrated below.

The photocuring composition of the present invention is coated on a support body such as a glass plate, a polycarbonate plate, a silicone wafer, a plastic sheet, or paper by a coating method using a bar coater, a spin coater, or a roll coater, or such method as spray coating, dipping, gravure printing, or screen printing, and the solvent is dried to form a smooth film. For forming desired pixels on the film, ultraviolet rays are irradiated via a negative photomask usually at 50 to 2000 mJ/cm$^2$, preferably at 100 to 1000 mJ/cm$^2$. In this step, it is preferred to use a mask aligner or the like device so that parallel rays are uniformly irradiated over the entire film. If necessary, the irradiated film may be heated for a short period of time to promote polymerization. Then the obtained product is immersed in a developing solution or exposed to a shower of a developing solution to dissolve the uncured portions of the film for development. The remaining portions of the film are cured completely by a high temperature post baking process to obtain the desired black matrix. The preferable film thickness of the black matrix is usually 0.2 to 5.0 $\mu$m.

As the developing solution, an aqueous solution of inorganic alkali such as sodium hydroxide, potassium hydroxide, sodium carbonate, or sodium metasilicate; or organic amine such as tetramethylammoniumhydroxide may preferably be used.

Examples of the process of forming a black matrix on a color filter with the hardening composition of the present invention may include; (i) a method of forming a black matrix on a plate such as a glass plate, and then forming colored layers of red, green, and blue thereon; (ii) a method of forming colored layers of red, green and blue on a glass plate and the like, and then forming a black matrix thereon; or (iii) a method of previously forming a black matrix and each colored layer on a separate plate respectively or in combination, and then transferring the previously formed black matrix and the colored layers onto the plate for a color filter.

With the substrate having a black matrix formed of the hardening composition of the present invention, the conductivity can be controlled over a wide range depending on the usage. That is, the volume resistivity of the obtained black matrix can be changed arbitrarily over a wide range by selecting the manufacturing conditions of the carbonaceous material constituting the requisite component of the present invention. Specifically, the volume resistivity of the black matrix can be increased by using a polymer having higher number average molecular weight of 2000 to 50000 as the polymer (b), or by increasing the weight ratio of the polymer (b) to the carbon material (a) to 0.4 to 4. On the other hand, the volume resistivity of the black matrix can be maintained at a lower level similar to that of the carbonaceous material by using a polymer having lower number average molecular weight of 300 to 7000 as the polymer (b), or by lowering the weight ratio of the polymer (b) to the carbon material (a) to not less than 0.05 and less than 0.4.

For the sole purpose of decreasing the volume resistivity of the black matrix, the carbonaceous material of the present invention is not always necessary since a carbonaceous material generally has high conductivity. But for improving the definition of the black matrix and realizing the improvement in contrast by improving the dispersibility of the carbonaceous material remarkably, the above mentioned carbonaceous material is the most effective for use.

The volume resistivity required of the black matrix for a color filter formed of the hardening composition of the present invention may vary depending on its construction and the purpose. In producing a color filter having red, green, and blue pixels using a substrate having the black matrix by electrodeposition, if the volume resistivity of the black matrix is low, the colored coating material for electrodeposition may be over-coated on the black matrix. In order to avoid this, the volume resistivity of the black matrix is preferably $1 \times 10^5 \Omega \cdot cm$ to $1 \times 10^{15} \Omega \cdot cm$. The black matrix of high volume resistivity cannot be formed with carbonaceous material which is produced under the ordinary conditions different from those of the above mentioned particular carbonaceous material.

The black matrix formed of the hardening composition of the present invention can also be used for a counter-electrode substrate for a black and white display TFT array substrate, besides a color filter. The hardening composition of the present invention may preferably be used for giving light-shielding properties to a liquid crystal sealing agent or spacers for a liquid crystal display. For these particular purposes, it is preferred to use the carbonaceous material having high volume resistivity of $1 \times 10^5 \Omega \cdot cm$ to $1 \times 10^{15} \Omega \cdot cm$.

The hardening composition of the present invention can be charged with great volume of pigment and can be solubilized in alkaline water since it contains as the requisite component the specific carbonaceous material having acid groups which enables dispersion in water. Therefore, it is useful for producing easily a black matrix which is superior in light-shielding properties and resolution and of which conductivity is controlled.

In general, it is difficult to complete polymerization of a radical polymerizing resin containing a carbon material such as ordinary carbon black as a black-hued coloring agent due to the polymerization inhibiting effect of the carbon black and the like. As a result, the radical polymerizing resist containing ordinary carbon material has a problem of insufficient adhesivity of pixels to the plate, leading to removal of pixels upon development, low resolution, and elusion of residing monomers from cured film by a solvent. In contrast, the hardening composition of the present invention containing the particular carbonaceous material as the coloring agent is not susceptible to polymerization defect, and the above drawbacks can be prevented.

EXAMPLES

The present invention is now explained in more detail with reference to Examples, Comparative Examples, and Application Examples, but the present invention is not limited thereto.

Synthesis Example 1
Synthesis of Carboxyl Group-Containing Carbon Black (GC-1)

1500 g of isopropyl alcohol was charged into a reactor of 5 liter capacity fitted with a stirrer, a condenser, and a thermometer, heated to 65° C., and stirred. Subsequently, a mixture consisting of 684 g of isobutyl acrylate, 118 g of butyl acrylate, 326 g of methyl methacrylate, 210 g of hydroxyethyl acrylate, 154 g of t-butyl acrylate, 8 g of glycidyl methacrylate, and 10 g of azoisobutyronitrile as a polymerization initiator, was continuously added dropwise into the reactor over 4 hours, and then the reaction was continued for 2 hours. The temperature was then elevated up to 80° C. and the reaction was continued for one hour to obtain copolymers having number average molecular weight of 12000. It was confirmed by IR, $^1$H-NMR, and $^{13}$C-NMR that the polymers included epoxy groups, hydroxyl groups, and t-butyloxycarbonyl groups.

600 g of copolymer varnish with 50% by weight solid content of the above copolymer and 300 g of carbon black (manufactured by Degussa AG under the trade name of "Special Black 4", particle size: 25 nm; the pH value of an aqueous suspension of the carbon black measured by the method of ISO-787-9 with a glass electrode is 2.5) were charged into a stainless beaker, and isopropyl alcohol was added to the mass to adjust the solid content to be 35% by weight. The resulting mixture was kneaded for 30 minutes. Then glass beads were added to the mixture and stirred at 3000 rpm for 2 hours. Excess isopropyl alcohol was evaporated under reduced pressure, and the obtained paste was kneaded by a kneader at 60 rmp at 130° C. for 15 minutes for completing removal of the solvents and reaction, thereby obtaining carbon black contacted with the polymer.

Next, 300 g of the obtained carbon black contacted with the polymer were dissolved in diethylene glycol dimethyl ether at 100° C., and the insoluble components were filtered out. The obtained filtrate with solid content of 20% by weight was charged in a three-neck flask, admixed with 50 ml of 3N aqueous solution of hydrochloric acid with the nitrogen gas being blown into the flask, and stirred under heating at 80° C. for 1 hour. The mixture was then concentrated under reduced pressure at 60° C. to obtain acid group-containing carbon black having carboxyl groups introduced into the copolymer portions thereof(GC-1). The content of carboxyl groups in GC-1 was 35 mmol per 100 g of the carbonaceous material (GC-1).

Synthesis Example 2
Synthesis of Carboxyl Group-Containing Carbon Black (GC-2)

1500 g of diethylene glycol dimethyl ether was charged into a reactor of 5 liter capacity fitted with a stirrer, a condenser, and a thermometer, heated at 80° C., and stirred. Subsequently, a mixture consisting of 20 g of isopropenyloxazoline, 140 g of t-butylacrylate, 275 g of isobutylmethacrylate, 130 g of butylacrylate, 235 g of methylmethacrylate, 225 g of styrene, 475 g of nonylphenoxy polyethyleneglycol acrylate, and 10 g of azoisobutyronitrile as a polymerization initiator was continuously added dropwise into the reactor over 4 hours, and then the reaction was continued for 2 hours. The temperature was then elevated up to 80 ° C. and the reaction was continued for one hour to obtain copolymers having number average molecular weight of 13000. It was confirmed in the same way as in Synthesis Example 1 that the obtained polymer included oxazoline groups, and t-butyloxycarbonyl groups.

600 g of copolymer varnish with 50% by weight solid content of the above copolymer and 300 g of the carbon black as used in Synthesis Example 1 were charged into a stainless beaker, and diethylene glycol dimethyl ether was added to the mass to adjust the solid content to be 35% by weight. The resulting mixture was kneaded for 30 minutes. Then glass beads were added to the mixture and stirred at 3000 rpm for 2 hours. Excess diethylene glycol dimethyl ether was evaporated under reduced pressure, and the obtained paste was kneaded by a three-roll kneader at 10 rpm at 130° C. for 15 minutes for completing removal of the solvents and reaction, thereby obtaining carbon black contacted with the polymer.

Next, 300 g of the obtained carbon black contacted with the polymer were dissolved in diethylene glycol dimethyl ether at 100 ° C., and the insoluble components were filtered out. The obtained filtrate with solid content of 20% by weight was charged in a three-neck flask and stirred under heating at 150° C. for 4 hours. The mixture was then concentrated under reduced pressure at 100° C. to obtain an acid group-containing carbon black having carboxyl groups introduced into the copolymer portions thereof (GC-2). The content of carboxyl groups in GC-2 was 33 mmol per 100 g of the carbonaceous material (GC-2).

Synthesis Example 3
Synthesis of Carboxyl Group-Containing Graphite (GC-3)

5 600 g of the copolymer varnish with 50% by weight solid content of the copolymer prepared in Synthesis Example 1 and 200 g of fine powders of graphite were charged into a stainless beaker and kneaded for 30 minutes. Then glass beads were added to the mixture and stirred at 3000 rpm for 2 hours. Excess isopropyl alcohol was evaporated under reduced pressure, and the obtained paste was kneaded by a kneader at 60 rpm at 100° to 120° C. for 15 minutes for completing removal of the solvents and reaction, thereby obtaining graphite contacted with the polymer.

Next, 300 g of the obtained graphite contacted with the polymer were dissolved in diethylene glycol dimethyl ether at 100° C., and the insoluble components were filtered out. The obtained filtrate with solid content of 20% by weight was charged in a three-neck flask, admixed with 50 ml of 3N aqueous solution of hydrochloric acid with the nitrogen gas being blown into the flask, and stirred under heating at 80° C. for 1 hour. The mixture was then concentrated under reduced pressure at 60° C. to obtain carboxyl group-containing graphite having carboxyl groups introduced into the copolymer portions thereof (GC-3). The content of carboxyl groups in GC-3 was 43 mmol per 100 g of the carbonaceous material (GC-3).

Synthesis Example 4
Synthesis of Carbon Black Not Containing Carboxyl Groups (GC-4)

1500 g of isopropyl alcohol was charged into a reactor of 5 liter capacity fitted with a stirrer, a condenser, and a thermometer, heated to 65° C., and stirred. Subsequently, a mixture consisting of 838 g of isobutylacrylate, 118 g of butylacrylate, 326 g of methylmethacrylate, 210 g of hydroxyethylacrylate, 8 g of glycidylmethacrylate, and 10 g of azoisobutyronitrile as a polymerization initiator was continuously added dropwise into the reactor over 4 hours, and the reaction was continued for 2 hours. The temperature was then elevated up to 80° C. and the reaction was continued for 1 hour to obtain copolymers having number average molecular weight of 12000. It was confirmed in the same way as in Synthesis Example 1 that the polymers did not include t-butyloxycarbonyl groups and carboxyl groups. 600 g of copolymer varnish with 50% by weight solid content of the above copolymer and 300 g of the carbon black as used in Synthesis Example 1 were charged into a stainless beaker, and isopropyl alcohol was added to the mass to adjust the solid content to be 30% by weight.

The resulting mixture was kneaded for 30 minutes. Then glass beads were added to the mixture and stirred at 3000 rpm for 2 hours. Excess isopropyl alcohol was evaporated under reduced pressure, and the obtained paste was admixed with 10% by weight of diethylene glycol dimethyl ether based on the total weight of the resulting mixture. The resulting mixture was kneaded by a kneader at 60 rpm at 140° C. for 20 minutes for completing removal of the solvents and reaction, thereby obtaining polymer contacted-carbon black substantially free of carboxyl groups (GC-4). The content of carboxyl groups in GC-4 was 0.5 mmol per 100 g of the carbonaceous material (GC-4)

Synthesis Example 5
Synthesis of Carboxyl Group-Containing Carbon Black (GC-5)

100 g of the carbon black as used in Synthesis Example 1 were suspended in 300 g of benzene, and the mixture was azeotropically dehydrated, admixed with 50 g of thionyl chloride at 80° C., and stirred for 50 hours under heating. After the reaction, benzene and unreacted thionyl chloride were removed under reduced pressure, and the remaining mass was dried in vacuo at 90° C. for 24 hours. Subsequently, 60g of the obtained carbon black having acid chloride groups introduced, 10 g of 2,2'-azobis (2-cyanopropanol), 800 ml of dioxane, and 100 ml of α-picoline were charged in a flask of 2000 ml capacity, and stirred at the room temperature under nitrogen atmosphere for 8 hours by a magnet stirrer. The reacted carbon black was washed thoroughly with methanol, and dried in vacuo at the room temperature.

Next, to a mixture of 60 g of the carbon black having 10 azo groups introduced therein and 100 g of butyl cellosolve, a solution containing 34 g of isobutylacrylate, 6 g of butylacrylate, 16 g of methylmethacrylate, 11 g of hydroxyethylacrylate, and 10 g of acrylic acid was added under nitrogen atmosphere at 70° C. over 6 hours under heating and stirring. After the completion of adding the solution, the resulting mixture was heated up to 80° C. and further reacted for 2 hours.

After the reaction, unreacted monomers and the 20 solvents were removed under reduced pressure for concentrating the mixture, and the obtained concentrate was dissolved in ethanol. The ethanol solution of the concentrate was centrifuged at 20000 G, the supernatant was removed, and the precipitate was dried to obtain 102 g of carboxyl group-containing carbon black (GC-5). The content of carboxyl groups in GC-5 was 25 mmol per 100 g of the carbonaceous material (GC-5).

Example 1

50 g of acrylic resin having carboxyl groups and 5 hydroxyl groups manufactured by TOA GOSEI CHEMICAL INDUSTRY CO., LTD. under the trade name of "ARON S-4030", 25 g of alkylated methylolmelamine manufactured by SUMITOMO CHEMICAL CO., LTD. under the trade name of "M-66B", and 25 g of ethyl cellosolve acetate were mixed to obtain thermosetting resin A. Then to 100 g of the obtained thermosetting resin A, 100 g of the acid group-containing carbon black (GC-1) synthesized in Synthesis Example 1 and 33 g of ethyl cellosolve acetate were added to make a dispersion, thereby obtaining a black-hued thermosetting composition.

The black-hued thermosetting composition was applied over a glass substrate of 1.1 mm thick having ITO (indium tin oxide) film of 100 nm thick on the surface thereof (trade name "CORNING 7059 GLASS") by a roll coating method to have the dry film thickness of 1.5 $\mu$m, and the coated film was heated at 100 ° C. for 5 minutes. Then, over the coated film, positive photoresist consisting of naphthoquinone diazido compound and a novolak cresol resin manufactured by TOKYO OHKA KOGYO CO., LTD. under the trade name of "OFPR-800" was applied by a spin-coating method to have a dry film thickness of 1.0 μm. The resulting product was irradiated with the light from an ultra-high pressure mercury lamp at 200 mJ/cm$^2$ via a photomask having lattice patterned light-shielding portions of 20 μm wide with the longitudinal and transverse gaps between the portions being 50 μm, corresponding to the pattern of the black matrix to be obtained, and then developed for 30 seconds with a shower of a 0.2 wt % aqueous solution of tetramethyl ammonium hydroxide. The obtained substrate was heated at 110° C. for 20 minutes, irradiated with the light from an ultra-high pressure mercury lamp at 200 mJ/cm$^2$, and developed for 30 seconds with a shower of a 0.2 wt % aqueous solution of tetramethyl ammonium hydroxide, thereby removing the photoresist on the black matrix. The obtained substrate was heated at 220° C. for 1 hour to obtain a black matrix having the film thickness of 1.5 μm, the OD value of 3.1, and the volume resistivity of $1 \times 10^{10} \Omega \cdot cm$.

With the master plate having the black matrix thereon (master plate 1), a color filter was produced by a pigment dispersion method.

Using a color mosaic system, manufactured by FUJI HUNT ELECTRONICS TECHNOLOGY KK under the trade name of "CR-2000", "CG-2000", and "CB-2000", red, green and blue hues were charged in the gaps between the light-shielding layers on the master plate 1 with the film thickness of 1.5 μm, in accordance with the processing method as designated by these systems, thereby producing a color filter having high resolution and excellent planarity. The photomask employed for the light exposure had the light-transmitting portions equally dimensioned to the gaps between the black matrix.

Example 2

100 g of the thermosetting resin A prepared in Example 1 and 100 g of the acid group-containing graphite (GC-3) synthesized in Synthesis Example 3 were mixed to obtain a black-hued thermosetting resin composition.

Using this black-hued thermosetting resin composition, a black matrix of 1.5 μm thick was formed on the glass substrate as used in Example 1 by a printing method. After heating the obtained substrate at 220° C. for 1 hour, the OD value was 3.0 and the volume resistivity was $1 \times 10^{10} \Omega \cdot cm$.

Example 3

60 g of phenol novolak epoxy acrylate, 10 g of dipentaerythritol hexaacrylate, 4 g of a photopolymerization initiator manufactured by CIBA GEIGY AG under the trade name of "IRGACURE 907", 1 g of diethylthioxanthone, and 25 g of ethyl cellosolve acetate were mixed to obtain photosensitive resin A. Then to 100 g of the obtained photosensitive resin A, 100 g of the acid group-containing carbon black (GC-1) synthesized in Synthesis Example 1 and 33 g of ethyl cellosolve acetate were added to make a dispersion, thereby obtaining a black-hued photopolymerizable composition.

The black-hued photopolymerizable composition was applied over the glass substrate as used in Example 1 by a spin-coating method to have the dry film thickness of 1.5 μm, and heated at 85° C. for 5 minutes. The resulting product was irradiated with the light from an ultra-high pressure mercury lamp at 200 mJ/cm$^2$ via a photomask having lattice patterned light-transmitting portions of 20 μm wide with the longitudinal and transverse gaps between the portions being 50 μm, corresponding to the pattern of the black matrix to be obtained, and then developed for 30 seconds with a shower of a 0.2 wt % aqueous solution of tetramethyl ammonium hydroxide, thereby obtaining a black matrix having excellent resolution. The obtained substrate was heated at 220° C. for 1 hour to obtain a black matrix having the film thickness of 1.2 μm, the OD value of 3.0, and the volume resistivity of $\times 10^{10} \Omega \cdot cm$.

With the master plate having the black matrix thereon (master plate 2), a color filter was produced by a pigment dispersion method.

Using the color mosaic system as in Example 1, red, green, and blue hues were charged in the gaps between the light-shielding layers of the master plate 2, thereby obtaining a color filter having high resolution and excellent planarity. The photomask employed for the light exposure had the light-transmitting portions equally dimensioned to the black matrix.

Example 4

54 g of polybasic acid-added trisphenol epoxy acrylate, 9 g of trimethylolpropane triacrylate manufactured by NIPPON KAYAKU CO., LTD. under the trade name of "KAYARAD R5198", 7 g of "Alicyclic Epoxy Monomer AK601"(trade name) manufactured by NIPPON KAYAKU CO., LTD., 2 g of "IRGACURE 369"(trade name) manufactured by CIBA GEIGY AG, 1 g of 1-chloro-4-propoxythioxanthone, 1 g of biimidazole, 1 g of 2-mercaptobenzoxazole, and 25 g of ethyl cellosolve acetate were mixed to obtain photosensitive resin B. Then, to 100 g of the photosensitive resin B, 100 g of the acid group-containing carbon black (GC-2) synthesized in Synthesis Example 2 and 33 g of ethyl cellosolve acetate were added to make a dispersion, thereby obtaining a black-hued photopolymerizable composition.

The black-hued photopolymerizable composition was applied over the glass substrate having ITO film of 100 nm thick on the entire surface thereof as used in Example 1 by a spin-coating method to have the dry film thickness of 1.5 μm, and the coated film was dried at 85° C. for 5 minutes. The resulting product was irradiated with the light from an ultra-high pressure mercury lamp at 200 mJ/cm$^2$ via a photomask having lattice patterned light-transmitting portions of 20 μm wide with the longitudinal and transverse gaps between the portions being 50 μm, corresponding to the pattern of the black matrix to be obtained, and then developed for 30 seconds with a shower of a 0.2 wt % aqueous solution of tetramethyl ammonium hydroxide, thereby obtaining a black matrix having high resolution. The obtained substrate was heated at 220° C. for 1 hour to obtain a black matrix having the film thickness of 1.3 μm, the OD value of 3.0, and the volume resistivity of $1 \times 10^{9} \Omega \cdot cm$.

With the master plate having the black matrix thereon (master plate 3), a color filter was produced by a electrodeposition method.

Over the master plate 3, positive photoresist manufactured by TOKYO OHKA KOGYO CO., LTD. under the trade name of "OFPR-800" was applied by a spin-coating method to have the dry film thickness of 2.0 μm. Then, using a photomask having a mosaic-shaped pattern in which the light exposure portions were larger longitudinally and transversely by 10 μm than the gap between the light-shielding portions, light exposure and development were performed for removing the portions exposed to light thereby lay the ITO film thereat to the outside. Then, DC voltage of 40 V was applied at 25° C. for 10 seconds across the master plate 3 as an anode and a stainless steel beaker containing a red-hued coating material (R) exhibiting anionic electrodeposition properties as a cathode, to perform electrodeposition. The master plate 3 was hoisted from the stainless steel beaker, washed with ion-exchanged water, dried, and heated at 120° C. for 10 minutes, thereby obtaining a red-hued mosaic patterned layer. Subsequently, after light exposure and development of another mosaic patterned layer adjacent to this mosaic patterned layer, electrodeposition and heating of green-hued coating material (G) was carried out in the same way as in the red-hued coating material (R). The same process was repeated for blue-hued coating material (B), thereby obtaining a color filter. No over-coating of the colored coating materials on the light-shielding layers in each electrodeposition process was recognized. Incidentally, the development solution used in the above process was a 1 wt % aqueous solution of sodium hydroxide containing 5 wt % of a surfactant manufactured by KAO CO., LTD. under the trade name of "PEREX NBL". Finally, the substrate was heated at 180° C. for 30 minutes to complete curing, thereby obtaining a color filter having black-hued light-shielding layers with high precision, exhibiting excellent transparency, uniformity, and planarity.

Comparative Example 1

100 g of the photosensitive resin A prepared in Example 1, 100 g of the polymer-contacted carbon black without acid groups (GC-4) synthesized in Synthesis Example 4, and 33 g of ethyl cellosolve were mixed to obtain a black-hued photocuring resin composition. An attempt was made to produce a black matrix with the black-hued photocuring resin composition in the same way as in Example 1, but only a black matrix with remarkably poor resolution was obtained due to the inferior development properties of the black-hued coating film.

Comparative Example 2

100 g of the photosensitive resin A prepared in Example 1, 100 g of the acid group-containing carbon black (GC-5) synthesized in Synthesis Example 5, and 33 g of ethyl cellosolve were mixed to obtain a black-hued photocuring resin composition. A black matrix was produced with the black-hued photocuring resin composition in the same way as in Example 1. The resulting product was heated at 200° C. for 1 hour to obtain a black matrix having the film thickness of 2.0 μm, the OD value of 2.7, and the volume resistivity of $1 \times 10^2 \Omega \cdot cm$.

An attempt was made to produce a color filter with the master plate having this black matrix (master plate 4) by an electrodeposition method in the same way as in Example 3, but the colored coating materials were over-coated on the black matrix to increase the film thickness of the black matrix portions, thereby obtaining only the color filter of poor planarity.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A hardening composition comprising a carbonaceous material and a thermosetting resin, said carbonaceous material being obtained by reacting carbon black with a polymer comprising (i) at least one reactive group selected from the group consisting of an aziridine group, oxazoline group, N-hydroxyalkylamido group, epoxy group, thioepoxy group, isocyanato group, a hydroxyl group, amino group, vinyl group, acryl group, and methacryl group; and (ii) a t-butyloxycarbonyl group;

wherein said hardening composition is thermosetting and said thermosetting resin is an acrylic resin having at least one of said reactive group.

2. A hardening composition comprising a carbonaceous material, a photocuring compound having at least one carbon-carbon double bond, and a photopolymerization initiator, said carbonaceous material being obtained by reacting carbon black with a polymer comprising (I) an aziridine group, oxazoline group, N-hydroxyalkylamido group, epoxy group, thioepoxy group, isocyanato group, a hydroxyl group, amino group, vinyl group, acryl group, and methacryl group; and (ii) a t-butyloxycarbonyl group;

wherein said hardening composition is photocuring, said photocuring compound is a mixture of phenol novolak epoxy acrylate and dipentaerythritol hexaacrylate, and said photopolymerization initiator is 2-methyl-1-(4-(methylthio)phenyl)-2-morpholinopropan-1-one.

3. The composition as claimed in claims 1 or 2, wherein said carbon black has a pH value of not more than 7 as measured in an aqueous solution.

4. The composition as claimed in claims 1 or 2 wherein the polymer has an average molecular weight of about 1000 to 100,000.

5. The composition as claimed in claims 1 or 2 wherein said reactive group is present in an amount of from about 1 to 500 mmol per 100 g of the polymer, and said alkoxycarbonyl group is present in an amount of from about 1 to 500 mmol per 100 g of the polymer.

6. The composition as claimed in claims 1 or 2 wherein said carbonaceous material is mixed with said polymer in a ratio of about 1:0.5 to 1:10 by weight.

7. The composition as claimed in claims 1 or 2 wherein said carbonaceous material comprises a carboxyl group produced by eliminating a protective group $R^1R^2R^3C-$ from the t-butylcarbonyl group.

8. The composition as claimed in claim 7 wherein said carboxyl group is present in an amount of about 10 to 500 mmol per 100 g of the carbonaceous material.

9. The composition as claimed in claims 1 or 2 wherein the carbonaceous material has a volume resistivity of not less than $1 \times 10^8 \Omega \cdot cm$.

10. The composition as claimed in claim 1 wherein the carbonaceous material is mixed with the thermosetting resin at a ratio of about 1:0.1 to 1:8 by weight.

11. The composition as claimed in claim 1 further comprising at least one of a curing agent and a coloring agent.

12. The composition as claimed in claim 11 wherein said curing agent is selected from the group consisting of melamine, benzoguanamine, urea, melamine resin, urea resin, phenol resin, blocked isocyanates, and mixtures thereof.

13. The composition as claimed in claim 2 wherein said carbonaceous material has a carboxyl group produced by eliminating a protective group $R^1R^2R^3C-$ from the t-butylcarbonyl group and wherein glycidyl(meth)acrylate is added to a part of said carboxyl group.

14. The composition as claimed in claim 2 wherein the carbonaceous material is present in an amount of 20 to 80% by weight of the composition.

15. The composition as claimed in claim 2 wherein the photocuring compound is present in an amount of about 30 to 80% by weight of the total weight of the composition.

16. The composition as claimed in claim 2 wherein said photopolymerization initiator is mixed with the photocuring compound in a ratio of about 0.005:1 to 0.3:1 by weight.

17. The composition as claimed in claim 2 further comprising a compound selected from the group consisting of a hexaarylbisimidazole compound, a hydrogen donor compound, and mixtures thereof, wherein a mixing ratio of said compound to the photocuring compound is about 0.005:1 to 0.3:1 by weight.

18. The composition as claimed in claim 2 further comprising an additive selected from the group consisting of a film forming polymer binder, an epoxy compound, and mixtures thereof.

* * * * *